United States Patent
Neumüller et al.

(10) Patent No.: US 6,258,472 B1
(45) Date of Patent: Jul. 10, 2001

(54) PRODUCT HAVING A SUBSTRATE OF A PARTIALLY STABILIZED ZIRCONIUM OXIDE AND A BUFFER LAYER OF A FULLY STABILIZED ZIRCONIUM OXIDE, AND PROCESS FOR ITS PRODUCTION

(75) Inventors: Heinz-Werner Neumüller, Uttenreuth; Wolfgang Schmidt, Erlangen; Klaus Heinemann, Niemetal; Jörg Wiesmann, Göttingen; Jörg Hoffmann, Göttingen; Jürgen Dzick, Göttingen; Herbert-Carl Freyhardt, Göttingen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/335,560

(22) Filed: Jun. 18, 1999

Related U.S. Application Data

(63) Continuation of application No. PCT/DE97/02925, filed on Dec. 16, 1997.

(30) Foreign Application Priority Data

| Dec. 18, 1996 | (DE) | 196 52 804 |
| Nov. 14, 1997 | (DE) | 197 50 598 |

(51) Int. Cl.[7] .......................... H01L 39/24; C23C 14/00; B32B 9/00
(52) U.S. Cl. .......................... 428/701; 428/689; 428/699
(58) Field of Search ..................... 428/689, 699, 428/701; 367/147

(56) References Cited

U.S. PATENT DOCUMENTS

| 4,703,463 | 10/1987 | Izard .................................... 367/147 |
| 5,105,801 | 4/1992 | Cathignol et al. ............... 367/147 X |
| 5,245,988 | 9/1993 | Einars et al. ...................... 367/147 X |
| 5,800,684 | * 9/1998 | Gagliardi et al. ..................... 204/192 |
| 5,930,046 | * 7/1999 | Solberg et al. ...................... 359/580 |

FOREIGN PATENT DOCUMENTS

| 911 222 | 4/1954 | (DE) . |
| 1 076 413 | 2/1960 | (DE) . |
| 1 814 561 | 8/1969 | (DE) . |
| 2 140 693 | 12/1984 | (GB) . |
| 33 19 871 A1 | 12/1984 | (DE) . |

OTHER PUBLICATIONS

Y. Iijima et al.: "Biaxially Aligned YSZ Buffer Layer on Polycrystalline Substrates", reprint from H. Hayakawa et al. (ed.): "Advances in Superconductivity IV", Proceedings of the 4th International Symposium on Superconductivity (ISS '91), Oct. 14–17, 1991, Tokyo, pp. 679–682.

Y. Iijima et al.: "In–plane aligned $YBa_2Cu_3O_{7-x}$ thin films deposited on polycrystalline metallic substrates", Appl. Phys. Lett. 60 (6), Feb. 10, 1992, pp. 769–771.

J. Wiesmann et al.: "Large–area deposition of biaxially textured YSZ buffer layers using an IBAD–process", Nuclear Instruments and Methods in Physics Research B 120 (1996), pp. 290–292; (No month).

(List continued on next page.)

Primary Examiner—Francis J. Lorin
(74) Attorney, Agent, or Firm—Herbert L. Lerner; Laurence A. Greenberg; Werner H. Stemer

(57) ABSTRACT

The invention relates to a product having a substrate of a partially stabilized zirconium oxide and a buffer layer of a fully stabilized zirconium oxide. In this case, the substrate is untextured and the buffer layer is biaxially textured and joined to the substrate via an interlayer which consists is made of a material that is different than zirconium oxide but is compatible with the latter. This product is in particular produced with ion beam-assisted deposition of the buffer layer. It is suitable in particular as a support for a functional layer of a ceramic superconductor, e.g. for use as a superconducting current limiter.

19 Claims, 1 Drawing Sheet

OTHER PUBLICATIONS

Yasuhiro Iijima et al.: "a–b Plane Aligned $YBa_2Cu_3O_{7-x}$ Thin Film Tapes", reprint from H. Hayakawa et al. (ed.): "Advances in Superconductivity IV", Proceedings of the $4^{th}$ International Symposium on Superconductivity (ISS '91), Oct. 14–17, 1991, Tokyo, pp. 514–520.

International Patent Application WO 96/33069 (Arendt et al.), dated Oct. 24, 1996 (No month).

K.S. Harshavardhan et al.: $YBa_2Cu_3O_{7-x}$ films on flexible, partially stabilized zirconia substrates with fully stabilized zirconia buffer layers, Appl. Phys. Lett. 59 (13), Sep. 23, 1991, pp. 1638–1640.

K. Rink et al.: "Incidence of cavitation in the fragmentation process of extracorporeal shock wave lithotriptors", Appl. Phys. Lett. vol. 64 No. 19, May 9, 1994, pp. 2596–2598.

Maurice Bourlion et al.: "Design and characterization of a shock wave generator using canalized electrical discharge: Application to lithotripsy", Review of Scientific Instruments, 65 (1994) Jul., No. 7, pp. 2356–2363.

W. Eisenmenger: "Experimentelle Bestimmung Der Stossfrontdicke Aus Dem Akustischen Frequenzspektrum Electromagnetisch Erzeugter Stosswellen In Fluessigkeiten Bei Einem Stossdruckbereich Von 10 Atm Bis 100 Atm", Acustics, vol. 14, 1964, No. 4, PP 187–204, experimental determination of the shock front thickness through the acoustical frequency spectrum of electromagnetically created shock waves in liquids with a shock pressure range between 10 and 100 atm. (No month).

* cited by examiner

PRODUCT HAVING A SUBSTRATE OF A PARTIALLY STABILIZED ZIRCONIUM OXIDE AND A BUFFER LAYER OF A FULLY STABILIZED ZIRCONIUM OXIDE, AND PROCESS FOR ITS PRODUCTION

CROSS-REFERENCE TO RELATED APPLICATION

This is a continuation of copending International Application PCT/DE97/02925, filed Dec. 16, 1997, which designated the United States.

BACKGROUND OF THE INVENTION

Field of the Invention

The invention relates to a product having a substrate of a partially stabilized zirconium oxide and a buffer layer of a fully stabilized zirconium oxide. The invention further relates to a process for producing such a product.

Such a product is disclosed in an article by K. S. Harshavardhan et al., Appl. Phys. Lett. 59 (1991) 1638.

The invention relates in particular to such a product whose buffer layer is used as a base for a layer of a ceramic superconductor, in particular a high temperature superconductor. A product supplemented in this way by a functional layer of a high temperature superconductor is, in particular, used in a superconducting current limiter for an electrical power distribution network. In such a current limiter, use is made of the fact that, at an appropriately low temperature, a superconductor maintains its superconductivity only as long as the current density of a current flowing through it remains below a particular limit value. This limit value is in principle depends on the temperature of the superconductor and any magnetic field that may be flowing through it. For a high temperature superconductor relevant to a technical application, the temperature is usually the temperature of liquid nitrogen at standard pressure; the magnetic field is conventionally assumed to be zero if no other specific indication is given.

The high temperature superconductor relevant for use in a superconducting current limiter, in particular a compound having the chemical formula $YBa_2Cu_3O_{7-x}$, or one of the thallium-containing compounds $(Tl, Pb)n (Ba, Sr)m Ca_kCu_lO_y$ with (nmkl)=(2212) or (1223) may be prepared for the indicated purpose in the form of a layer or an arrangement of layers, the layer or each layer having a thickness of the order of 1 mm and the layer or all layers having an area of several square meters. In a three-phase power distribution network according to conventional practice three such current limiters would need to be installed in parallel.

The product disclosed by the aforementioned article comprises a substrate of a polycrystalline partially stabilized zirconium oxide and a buffer layer of a fully stabilized zirconium oxide applied thereon. Zirconium oxide is distinguished by thermomechanical properties, in particular a coefficient of thermal expansion, which correspond well to the corresponding thermomechanical properties of the high temperature superconductor $YBa_2Cu_3O_{7-x}$. Zirconium oxide is therefore in principle particularly suitable as a substrate for a layer of a high temperature superconductor. Pure zirconium oxide must, however generally be ruled out since pure zirconium oxide is subject to phase transitions at certain temperatures and is accordingly not stable enough. It is, however, possible to hinder or fully prevent these phase transitions by adding another oxide, for example an oxide selected from the group consisting of yttrium oxide, alkaline earth metal oxides and rare earth oxides, to the zirconium oxide. A fully stabilized zirconium oxide is obtained, for example, by adding from 8 to 12, in particular 9 mol % of yttrium oxide, and a partially stabilized zirconium oxide, which has been found to be suitable as a substrate for high temperature superconductors, is obtained by adding 3 mol % of yttrium oxide to pure zirconium oxide.

An article by Y. Iijima et al., Appl. Phys. Lett. 60 (1992) 769 describes a product having a substrate of a nickel alloy, described in detail, which is coated with a biaxially textured high temperature superconductor of the aforementioned composition. The term "biaxial" texture is in this case intended to mean a texture in which each crystallite of the high temperature superconductor has crystallographic axes that are aligned in a particular way with regard to the macroscopic geometry of the layer. In this case, each crystallite has a crystallographic c-axis, relative to which the crystal structure of the crystallites has maximally high symmetry, which is aligned approximately parallel to a main axis aligned perpendicular to the layer. In this context, "approximately parallel" permits quite noticeable deviations of the orientation of a c-axis from the main axis; a full width at half maximum for the angular distribution for the orientation of the c-axes should however remain limited to a reasonable value. In the present context, this full width at half maximum may be up to 30°; a full width at half maximum of up to at most 10° is preferred. A c-axis can moreover be identified in tetragonal, hexagonal, rhombohedric and cubic crystal systems. In a tetragonal crystal system, the c-axis is four-fold, and in the other crystal systems it is six-fold; the cubic crystal system moreover has a plurality of c-axes. Other crystallographic axes, which form an orthogonal system together with the c-axis, are commonly referred to as the a-axis and b-axis. A further requirement of a biaxial texture is that the a-axes of the crystallites be approximately parallel with one another, the term "approximately parallel" again permitting a possibly significant deviation from parallel in the strict sense. A particularly preferred biaxial texture would be distinguished by a full width at half maximum for the angular distribution of the c-axes of below 5°, and a full width at half maximum for the angular distribution of the a-axes of below 10°. Functionally, a biaxial texture therefore to some extent reproduces a specially oriented monocrystalline structure in a polycrystalline structure.

In order to obtain the biaxial texture of the superconductor in the product disclosed by the article just mentioned, the metallic substrate of this product (polycrystalline and untextured as usual) is coated with a buffer layer of fully stabilized zirconium oxide. In the special coating process used to deposit the buffer layer, in which the fully stabilized zirconium oxide is evaporated by a first ion beam and is transported to the substrate as a beam of atoms or molecules, the substrate with the buffer layer growing on it is exposed to a second ion beam, incident at a particular angle. The effect of this second ion beam is that the buffer layer is deposited with the desired biaxial texture. On this biaxially textured buffer layer, the functional layer of the high temperature superconductor is then grown, to which end the high temperature superconductor is deposited with a conventional laser ablation process. The biaxial texture of the buffer layer is continued into the functional layer substantially by itself and therefore gives the latter as well the desired biaxial texture with a full width at half maximum or the aforementioned angular distribution of between 20° and 30°. The critical current strength of this functional layer is stated as $1.4 \times 10^4$ $A/cm^2$.

For further information about the production of a biaxially structured layer of fully stabilized zirconium oxide, reference may be made to an article by Iijima et al., Proc. of the 4th Intern. Symposium of Superconductivity, Tokyo, Oct. 14th–17th, 1991, p. 517 et seq., and an article by Iijima et al., Proc. of the 4th Intern. Symposium on Superconductivity, Tokyo, Oct. 14th–17th, 1991, p. 679 et seq. While the deposition of a biaxially structured buffer layer of fully stabilized zirconium oxide on a metallic substrate as described is successful, the deposition of such a buffer layer on a substrate of unstructured partially stabilized zirconium oxide fails.

SUMMARY OF THE INVENTION

Accordingly, the object of the invention is to provide a product of the type mentioned at the outset, which overcomes the cited disadvantages and drawbacks and which has a buffer layer of biaxially structured fully stabilized zirconium oxide.

With this and other objects in view, there is provided, in accordance with this invention, a product having a substrate of a partially stabilized zirconium oxide and a buffer layer of a fully stabilized zirconium oxide, in which the substrate is untextured and the buffer layer is biaxially textured and is joined to the substrate via an interlayer of a material that is different from zirconium oxide but is compatible with the latter.

According to the invention, the interlayer of material which is different from zirconium oxide but is compatible with the latter is provided between the substrate and the buffer layer. Construction of the buffer layer directly on the untextured zirconium oxide is therefore avoided, and instead is carried out on an interlayer of suitable material.

As the material for the interlayer, aluminum oxide, can be used, in particular magnesium oxide, cerium oxide and strontium titanate.

The requirements which the interlayer material needs to meet are only such that it allows a textured zirconium oxide layer to be constructed and, in terms of its appropriate thermomechanical properties, is compatible with zirconium oxide just as zirconium oxide is compatible with ceramic superconductors.

The interlayer preferably has a thickness of between 50 nm and 500 nm. It should also not have any gaps.

The buffer layer of the product preferably has a thickness of between 100 nm and 1500 nm.

According to a particularly preferred embodiment, the buffer layer of the product is aligned approximately perpendicular to a main axis and consists of crystallites with respective crystallographic c-axes, the distribution of angles between the main axis and a respective c-axis having a full width at half maximum of less than 10°. This refinement of the product is particularly important in connection with the use of the product as a base for a functional layer of a high temperature superconductor, since such biaxial texturing is very important in obtaining a high current-carrying capacity for such a functional layer.

A particular refinement of the product according to this invention is distinguished in that the buffer layer is directly coated with a functional layer of a ceramic superconductor, in particular a high temperature superconductor. This ceramic superconductor is, in particular, a compound according to the formula $YBa_2Cu_3O_{7-x}$.

It is particularly preferable if the functional layer has a critical current density of more than $10^4$ A/cm$^2$, in particular between $10^5$ A/cm$^2$ and $3 \times 10^6$ A/cm$^2$. Especially in order to qualify the product for use in a superconducting current limiter, the critical current density should be no less than $5 \times 10^4$ A/cm$^2$, and preferably at least $2 \times 10^5$ A/cm$^2$.

Preferably, the functional layer of the product also has biaxial texturing, the biaxial texturing corresponding to the aforementioned biaxial texturing of the buffer layer. This biaxial texturing of the functional layer is very beneficial for achieving a high critical current density of the functional layer.

The product supplemented by a superconducting functional layer is preferably used as a superconducting current limiter in a power distribution network.

With the object relating to a process and other objects in view, a process is provided according to this invention for producing a product having a substrate of a partially stabilized zirconium oxide and a buffer layer of a fully stabilized zirconium oxide, the substrate being untextured and the buffer layer being biaxially textured and joined to the substrate via an interlayer of a material that is different from zirconium oxide but is compatible with the latter, characterized by the following steps:

providing a substrate;

depositing the interlayer on the substrate; and depositing the buffer layer on the interlayer by ion beam-assisted deposition.

The ion beam-assisted deposition of a biaxially textured buffer layer is basically known from cited documents in the prior art, to which reference is hereby made.

In particular, the ion beam-assisted deposition is sputtering, which is a process in which the material of the interlayer is detached from a solid target by means of electrically charged particles, in particular electrons, oxygen ions or argon ions. The detached material is transported as a beam of atoms or molecules, possibly ionized, to the substrate and is deposited there, assisted by another ion beam with the desired biaxial texture being formed.

The deposition of the interlayer is also preferably carried out by sputtering, but here assistance by another ion beam is not absolutely necessary.

A functional layer of a ceramic superconductor, in particular a high temperature superconductor, is preferably deposited on the buffer layer when it has been deposited. This is done, in particular, by means of laser ablation, the material of the functional layer being detached from a corresponding target by a laser beam and being transported as a beam of atoms or molecules to the substrate, where it is deposited. As an alternative to laser ablation, thermal co-evaporation may be envisaged.

All the deposition processes mentioned above can be carried out purely physically, that is to say without a chemical reaction taking place; depending on the process selected, the presence of a reactive component, in particular oxygen, during the deposition may also be necessary. This is true, in particular, for the deposition of the ceramic superconductor, for which adjustment of the oxygen content is known to be of critical importance. The reactive component can be provided as a component of the atmosphere in which the deposition takes place, or in the form of a corresponding ion beam, for example in the context of ion beam-assisted deposition.

An illustrative embodiment of the invention will now be explained with reference to the drawing, which is not to be taken as a true-to-scale reproduction of a corresponding product, but slightly distorted to highlight particular features.

Other features which are considered as characteristic for the invention are set forth in the appended claims.

Although the invention is illustrated and described herein as embodied in a product having a substrate of a partially stabilized zirconium oxide and a buffer layer of a fully stabilized zirconium oxide, and a process for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
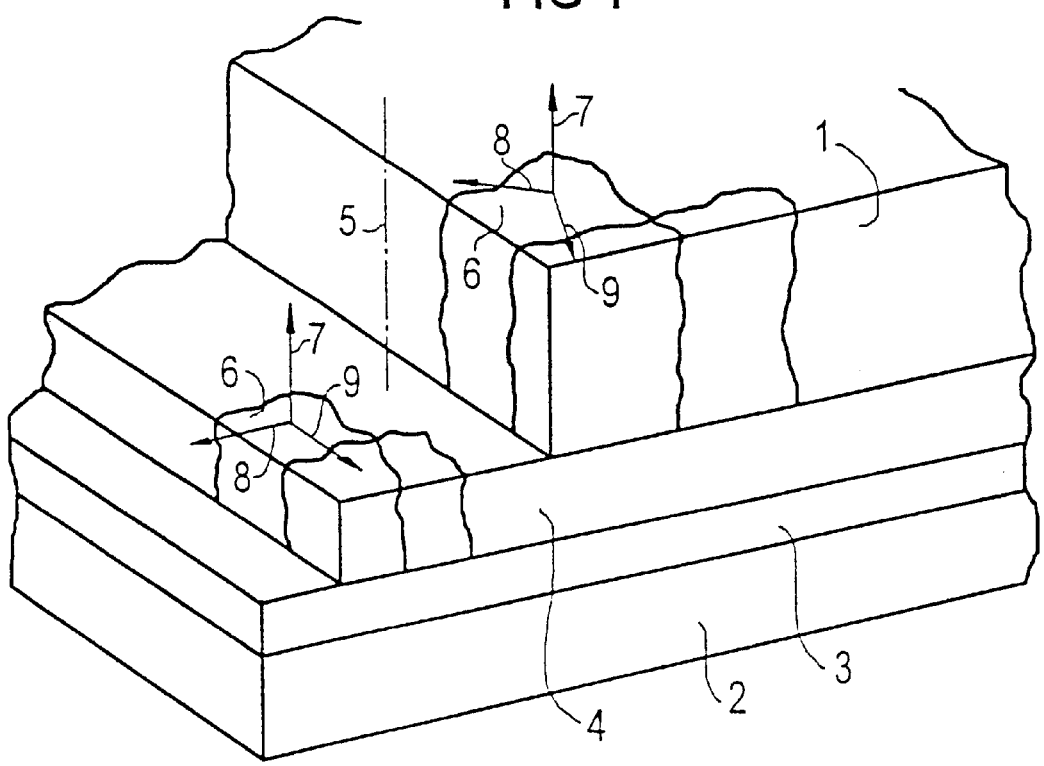
FIG. 1 is a diagrammatic representation of a product having a substrate of partially stabilized zirconium oxide and a buffer layer of fully stabilized zirconium oxide as well as a functional layer of a high temperature superconductor.

FIG. 1 shows a product which carries a functional layer 1 of the high temperature superconductor $YBa_2Cu_3O_{7-x}$.

The functional layer 1 is carried by a substrate 2 of partially stabilized zirconium oxide. The latter consists of a mixture of 97 mol % pure zirconium oxide and 3 mol % yttrium oxide, and is known in the art by the abbreviation "PSZ". Directly on the substrate 2 there is an interlayer 3 of aluminum oxide, the function of which will be explained below.

Directly on the interlayer 3 there is a buffer layer 4 of fully stabilized zirconium oxide. The latter is a mixture of 91 mol % pure zirconium oxide and 9 mol % yttrium oxide and is known in the art by the abbreviation "YSZ".

The functional layer 1 lies directly on this buffer layer 4. Both the substrate 2 and all the layers 3, 4 and 1 are essentially plane and oriented approximately perpendicular to a main axis 5.

The product is intended to be used in a superconducting current limiter, the function of which has already been explained. To that end, it is necessary for the functional layer 1 to have the highest possible critical current strength, corresponding to the highest possible carrying capacity for an electric current which flows through this functional layer 1 perpendicular to main axis 5. In order to achieve this, the crystallites 6 of the functional layer 1 need to be oriented in a special way, and the result of this special orientation is special texturing of the functional layer 1, referred to as "biaxial". As is known, such a biaxially textured functional layer 1 can be produced by growth on a correspondingly biaxially textured buffer layer 4. Accordingly, one option is to give the buffer layer 4 a biaxial texture first. Each crystallite 6 of the buffer layer 4, and likewise each crystallite 6 of the functional layer 1, has a crystal structure whose orientation is defined by three mutually orthogonal axes 7, 8 and 9, namely a c-axis 7, an a-axis 8 and a b-axis 9. The c-axis 7 is in this case a symmetry axis of the crystalline structure of the crystallites 6 with the maximum symmetry. The b-axis 9 and the a-axis 8 denote axes of the crystalline structure with respectively decreasing symmetry. In order to obtain the highest possible current-carrying capacity in the functional layer 1, it is necessary for the a-axes 8 and the b-axes 9 to be oriented substantially perpendicular to the main axis 5, that is to say aligned parallel to a plane defined by the functional layer 1. Correspondingly, the c-axis 7 must be oriented substantially parallel to the main axis 5. Further, all a-axes 8 should be substantially parallel to one another.

This corresponds to the aforementioned biaxial texturing. In reality, alignment of all c-axes 7 strictly parallel to the main axis 5 is scarcely ever obtained, but it is possible to keep to an angular distribution for the c-axes 7 which have a comparatively small full width at half maximum. With comparatively simple means, a full width at half maximum of less than 30° can be obtained, but this may still be too great for use of the product in a superconducting current limiter. It is preferable to obtain a full width at half maximum of less than 10°, and this is also possible with special processes. For the desired mutual parallelism of the a-axes 8, comparable considerations and preferences apply.

A process for producing the product first gives the buffer layer 4 with corresponding texturing, since experience shows that the functional layer 1 will, without further measures being needed, grow with the desired texturing on a buffer layer 4 textured in such a way. As the material for the buffer layer 4, fully stabilized zirconium oxide has proved suitable, but it has also been shown that correspondingly textured fully stabilized zirconium oxide cannot grow on a substrate 2 of untextured partially stabilized zirconium oxide.

In order nevertheless to obtain deposition of a biaxially textured buffer layer 4, the substrate 2 is first provided with an interlayer 3 of a material which is different from zirconium oxide but is thermomechanically compatible with the latter. This material is in the present case aluminum oxide, but other materials can also be considered. What is essential is that the material of the interlayer 3 does not lead to the creation of strong mechanical stresses at the interfaces with the substrate or the buffer layer 4, not even if the substrate is cooled from normal room temperature to the temperature of liquid nitrogen at standard pressure.

The thickness of the interlayer is dimensioned at a value of between 50 nm and 500 nm, which is likewise necessary for the purpose of avoiding mechanical stresses. The buffer layer 4 is deposited with a thickness of between 100 nm and 1500 nm. The biaxially textured functional layer 1 has, under experimental conditions, shown a critical current density of approximately $10^6$ A/cm$^2$ which meets a reasonably defined requirement for using the product in a superconducting current limiter. It is to be understood that the interlayer 7 should be as uniform, solid and free of gaps and cracks as possible, so that the buffer layer 4 can grow free of defects.

Figure 2:
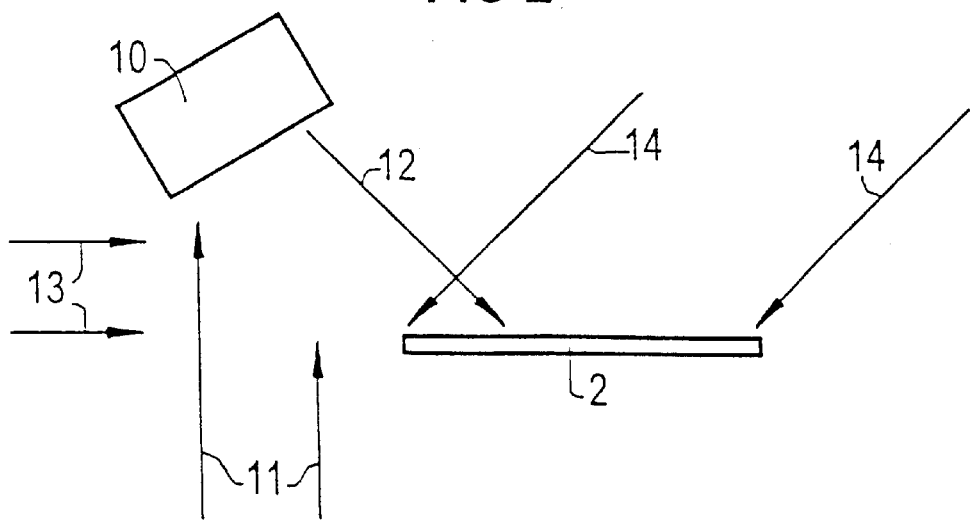
FIG. 2 shows a sketch outlining a process for producing such a product.

A process for producing the product shown in FIG. 1 is sketched in FIG. 2. The layer structure which is to be formed on the substrate 2 and was explained in more detail with reference to FIG. 1 is produced in the known way, by means of production processes which are purely physical, or by processes that involve a chemical reaction. The production of the buffer layer 4, which is sketched in FIG. 2 by way of indication, is particularly critical. The material for the buffer layer 4 is provided in the form of a solid body designated as a target 10. The latter is exposed to a laser, electron or ion beam 11, and as a result material is detached from the target 10 in the form of a beam 12 of atoms or molecules. This beam 12 is transported, suitably dispersed in a carrier gas 13, to the substrate 2 and is deposited there with the buffer layer 4 being formed. In order to obtain the desired biaxial texturing of the buffer layer 4, the substrate 2 is also exposed to an assisting ion beam 14. This assisting ion beam 14 can assure that the buffer layer 4 is deposited with the desired biaxial texture. Depending on the sign of the process, the carrier gas 13 can be inert i.e. have no direct effect on the actual deposition; it is also possible to select the carrier gas 13 such that it enters into a desired chemical reaction with the material of the target 10. This is important under certain circumstances when depositing the functional layer 1 from a high temperature superconductor, since in such a functional layer 1 the oxygen content is generally very critical and can be regulated through a controlled supply of oxygen by means of the carrier gas 13.

Preferred processes for depositing the interlayer 3 and the buffer layer 4 are sputtering processes, in which a suitable target 10 is exposed using an ion beam 11. For depositing the interlayer 3, the assisting ion beam 14 is not then generally necessary. For depositing the functional layer 1, a laser ablation process is preferred, in which the target 10 is exposed to a laser beam 11. In this case as well, assistance by the assisting ion beam 14 is not generally needed.

The product according to the invention is distinguished by a pronounced biaxial texture in a buffer layer 4 which is made from fully stabilized zirconium oxide and is carried by a substrate 2 of partially stabilized zirconium oxide. In order to permit the desired texturing of the buffer layer 4, an interlayer 3 of a suitable material different from zirconium oxide is first deposited on the substrate 2, and the buffer layer 4 is only deposited onto this interlayer 3. A disadvantageous interaction between the fully stabilized zirconium oxide of the buffer layer 4 and the partially stabilized zirconium oxide of the substrate 2 is avoided in this way. The product is in particular suitable as a carrier for a biaxially textured superconducting functional layer of a superconducting current limiter.

We claim:

1. A product comprising in combination:
   an untextured substrate of partially stabilized zirconium oxide;
   a biaxially textured buffer layer of fully stabilized zirconium oxide; and therebetween
   an interlayer of material which is different from zirconium oxide but is thermomechanically compatible with the latter, arranged between the buffer layer and the substrate.

2. The product according to claim 1, wherein the interlayer material comprises aluminum oxide.

3. The product according to claim 1, wherein the interlayer material comprises at least one of magnesium oxide, cerium oxide and strontium titanate.

4. The product according to claim 1, wherein the interlayer has a thickness of between 50 nm and 500 nm.

5. The product according to claim 1, wherein the buffer layer has a thickness of between 100 nm and 1500 nm.

6. The product according to claim 1, in which the buffer layer is aligned approximately perpendicular to a main axis and consists of crystallites with respective crystallographic c-axes, the distribution of angles between said main axis and a respective c-axis having a full width at half maximum of less than 10°.

7. The product according to claim 1, wherein the buffer layer is directly coated with a functional layer of a ceramic superconductor.

8. The product according to claim 7, wherein said ceramic superconductor is a high temperature superconductor.

9. The product according to claim 7, wherein the ceramic superconductor is a compound according to the formula $YBa_2Cu_3O_{7-x}$.

10. The product according to claim 7, wherein the functional layer has a critical current density of more than $10^4$ A/cm$^2$.

11. The product according to claim 10, wherein the functional layer has a critical current density between $10^5$ A/cm$^2$ and $3 \times 10^6$ A/cm$^2$.

12. The product according to claim 7, wherein the functional layer is aligned approximately perpendicular to a main axis and consists of crystallites with respective crystallographic c-axes, the distribution of angles between said main axis and a respective c-axis having a full width at half maximum of between 0° and 10°.

13. The product according to claim 7, wherein the functional layer has biaxial texturing.

14. A superconducting current limiter in a power distribution network comprising the product according to claim 7.

15. A process for producing a product having a substrate of partially stabilized zirconium oxide and a buffer layer of fully stabilized zirconium oxide, the substrate being untextured and the buffer layer being biaxially textured and joined to the substrate via an interlayer of material that is different from zirconium oxide but is compatible with the latter, comprising the following steps:
   providing a substrate;
   depositing the interlayer on the substrate; and
   depositing the buffer layer on the interlayer by ion beam-assisted deposition.

16. The process according to claim 15, wherein the ion beam-assisted deposition is sputtering.

17. The process according to claim 15, wherein the deposition of the interlayer is carried out by sputtering.

18. The process according to claim 15, wherein a functional layer of a ceramic superconductor is deposited on the buffer layer.

19. The process according to claim 18, wherein the functional layer is deposited by means of laser ablation.

* * * * *